United States Patent
Lee et al.

(10) Patent No.: US 8,410,852 B2
(45) Date of Patent: Apr. 2, 2013

(54) DRIVE AMPLIFIER

(75) Inventors: Young-Taek Lee, Gyeonggi-do (KR);
Si-Bum Jun, Gyeonggi-do (KR);
Jong-Soo Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 13/180,114

(22) Filed: Jul. 11, 2011

(65) Prior Publication Data

US 2012/0007676 A1 Jan. 12, 2012

(30) Foreign Application Priority Data

Jul. 12, 2010 (KR) .................. 10-2010-0066917

(51) Int. Cl.
*H03F 3/45* (2006.01)
(52) U.S. Cl. ...................................... 330/253
(58) Field of Classification Search .......... 330/253, 330/254, 260, 261
See application file for complete search history.

(56) References Cited

U.S. PATENT DOCUMENTS

| 4,887,047 | A  | * | 12/1989 | Somerville | 330/253 |
|-----------|----|---|---------|------------|---------|
| 5,578,965 | A  | * | 11/1996 | Kimura | 330/253 |
| 6,642,794 | B2 | * | 11/2003 | Mulder et al. | 330/254 |
| 6,927,629 | B2 | * | 8/2005 | Tomita | 330/252 |
| 2010/0248648 | A1 | * | 9/2010 | Suzuki | 330/253 |
| 2012/0068769 | A1 | * | 3/2012 | Wang et al. | 330/260 |

\* cited by examiner

*Primary Examiner* — Khanh V Nguyen
(74) *Attorney, Agent, or Firm* — The Farrell Law Firm, P.C.

(57) ABSTRACT

A drive amplifier having improved linearity while being characterized by low current consumption. The drive amplifier includes first and second transistors having a gate to which first and second differential Radio Frequency (RF) voltages are respectively input; a third transistor which has a drain connected to a drain of the second transistor and a source connected to the gate of the first transistor, and a drain-source current which increases with an increase in the second differential RF voltage; and a fourth transistor which has a drain connected to a drain of the first transistor and a source connected to the gate of the second transistor, and a drain-source current which increases with an increase in the first differential RF voltage.

14 Claims, 4 Drawing Sheets

DRIVE AMPLIFIER

PRIORITY

This application claims priority to an application filed in the Korean Industrial Property Office on Jul. 12, 2010, and assigned Serial No. 10-2010-0066917, the content of which is incorporated herein by reference.

BACKGROUND OF THE INVENTION

1. Field of the Invention

The present invention relates generally to a wireless communication system, and more particularly to a drive amplifier that is used at transmitting ends of a wireless communication system.

2. Description of the Related Art

As generally known in the art, a Radio Frequency Integrated Circuit (RFIC) manufactured using a Complementary Metal-Oxide Semiconductor (CMOS) process (CMOS RFIC) is inferior in performance to bipolar junction type transistors, and thus is not suitable for a communication scheme requiring high linearity, such as a Wideband Code Division Multiple Access (WCDMA) or Long Term Evolution (LTE) scheme.

In recent years, however, with price competitiveness of the CMOS RFIC having strengthened due to a reduction in the length of a CMOS transistor and the performance of the CMOS RFIC having improved by applying various topologies, the market share of the CMOS RFIC continues to increase.

The CMOS RFIC converts a signal received from a baseband modem into a high-frequency band signal, and transmits the converted signal through an antenna, or converts a signal received through an antenna into a baseband signal and delivers the converted signal to a baseband modem.

The performance of an RFIC transmitter circuit depends on the distortion of data to be transmitted. Thus, when specifying an RFIC transmitter circuit, the linearity of an output stage circuit, the phase noise of a local oscillation (OS) signal, the amount of IQ channel imbalance, the amount of an IQ origin offset (DC offset), and the like are considered. The specification may be defined by an Error Vector Magnitude (EVM), which is a transmission performance indicator important in WCDMA/HSPA, Mobile WiMax, LTE, and similar data transmission schemes.

Linearity of an output stage circuit is closely related to an Adjacent Channel Leakage Ratio (ACLR) characteristic, and thus it can be said that the development of a highly linear circuit is essential for improving the performance of a transmitting end.

One of the performance indicators that is notable in modern mobile communication terminals is current consumption. The lower the current consumption, the longer the battery life. Accordingly, the low-power characteristic is also an important factor for the evaluation of the performance of an RFIC.

FIG. 1 is a circuit diagram illustrating a conventional drive amplifier that is used at the transmitting end of a communication system.

In FIG. 1, a drive amplifier with a common source structure and a differential input/output structure is shown. In particular, the drive amplifier shown in FIG. 1 employs a pseudo-differential structure that has the advantage of a smaller third order non-linear component than a fully differential structure. As shown in FIG. 1, inductors 70, 80 are used as the load to solve a voltage headroom problem. RF signals passing through AC coupling capacitors 50, 60 are applied to the gate terminals of a Metal Oxide Semiconductor (MOS) transistors 10, 20, and bias voltages Vg are applied thereto, via resistors 30, 40. Further, the outputs Vout+, Vout- are connected to a Surface Acoustic Wave (SAW) filter external to the RFIC, and thus is converted into a single ended output.

In order to improve the linearity of an output signal in the conventional drive amplifier of the type described with reference to FIG. 1, the gate voltages Vg of the input MOS transistors 10, 20 must be high. That is, the gate voltages Vg of the input MOS transistors 10, 20 must be higher than the threshold voltage of the input MOS transistors 10, 20 by at least the magnitude of input RF voltages Vin+, Vin-. If the gate voltages Vg of the input MOS transistor 10, 20 are not sufficiently high, the gate voltages Vg are momentarily lower than the threshold voltage and will fall out of the saturation region, which may cause signal distortion.

However, if the gate voltages Vg are raised, then the currents flowing in the input MOS transistors 10, 20 are increased, which means an increase in the current flowing in the whole circuit. As a result, an excessively high gate voltage Vg will increase the current consumption at the transmitting end, resulting in rapid battery drain.

SUMMARY OF THE INVENTION

Accordingly, the present invention has been made to solve at least the above-mentioned problems occurring in conventional systems, and an aspect of the present invention provides a drive amplifier that can achieve low current consumption while maintaining linearity.

In accordance with an aspect of the present invention, there is provided a drive amplifier that includes first and second transistors having gates to which first and second differential Radio Frequency (RF) voltages are respectively input; a third transistor which has a drain connected to a drain of the second transistor and a source connected to the gate of the first transistor, and a drain-source current of which increases with an increase in the second differential RF voltage; and a fourth transistor which has a drain connected to a drain of the first transistor and a source connected to the gate of the second transistor, and a drain-source current of which increases with an increase in the first differential RF voltage.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS OF THE INVENTION

Figure 1:
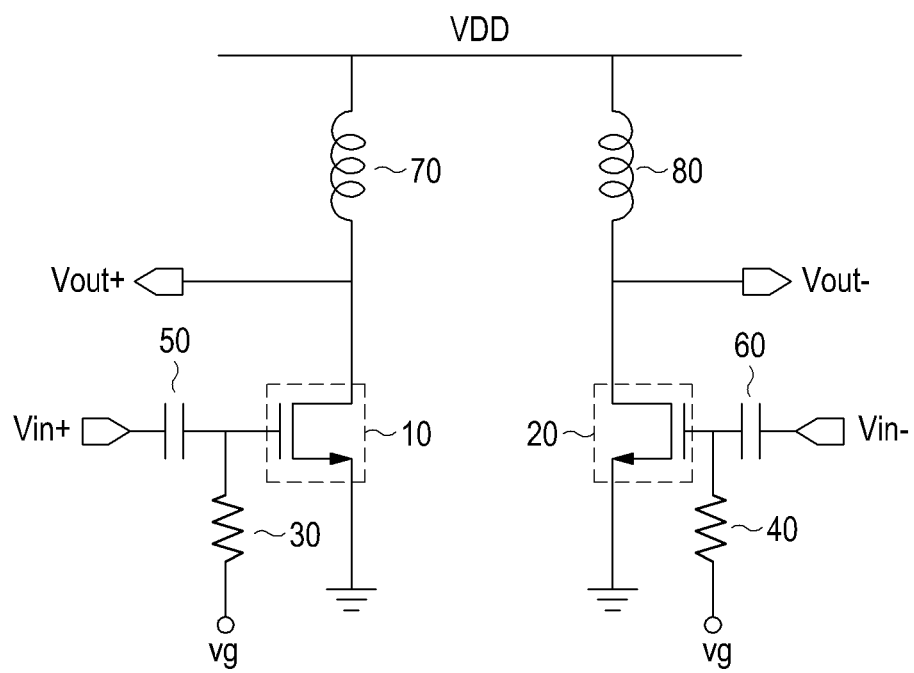
FIG. 1 is a circuit diagram illustrating a conventional drive amplifier that is used at the transmitting end of a communication system.

Hereinafter, various embodiments of the present invention will be described with reference to the accompanying drawings. In the following description, the same elements will be designated by the same reference numerals despite being shown in different drawings. Further, in the following description of the present invention, a detailed description of known functions and configurations incorporated herein will be omitted when it may make the subject matter of the present invention rather unclear.

As mentioned above, in order to ensure linearity in the conventional drive amplifier, the gate voltage Vg of an input MOS transistor is high, which increases the current flowing in the entire drive amplifier and consequently deteriorates the current characteristic of the drive amplifier, and also causes deterioration of the linearity to decrease the gate voltage of an input MOS transistor in order to ensure current characteristic in the conventional drive amplifier.

Accordingly, the present invention provides a drive amplifier that is improved in current characteristic without deterioration of its linearity. A drive amplifier according to an embodiment of the present invention, as described below, may be applied to other similar technical fields, as well as the wireless communication system.

First of all, the structure of a drive amplifier according to the present invention will be described with reference to FIG. 2, which illustrates a drive amplifier according to an embodiment of the present invention.

Figure 2:
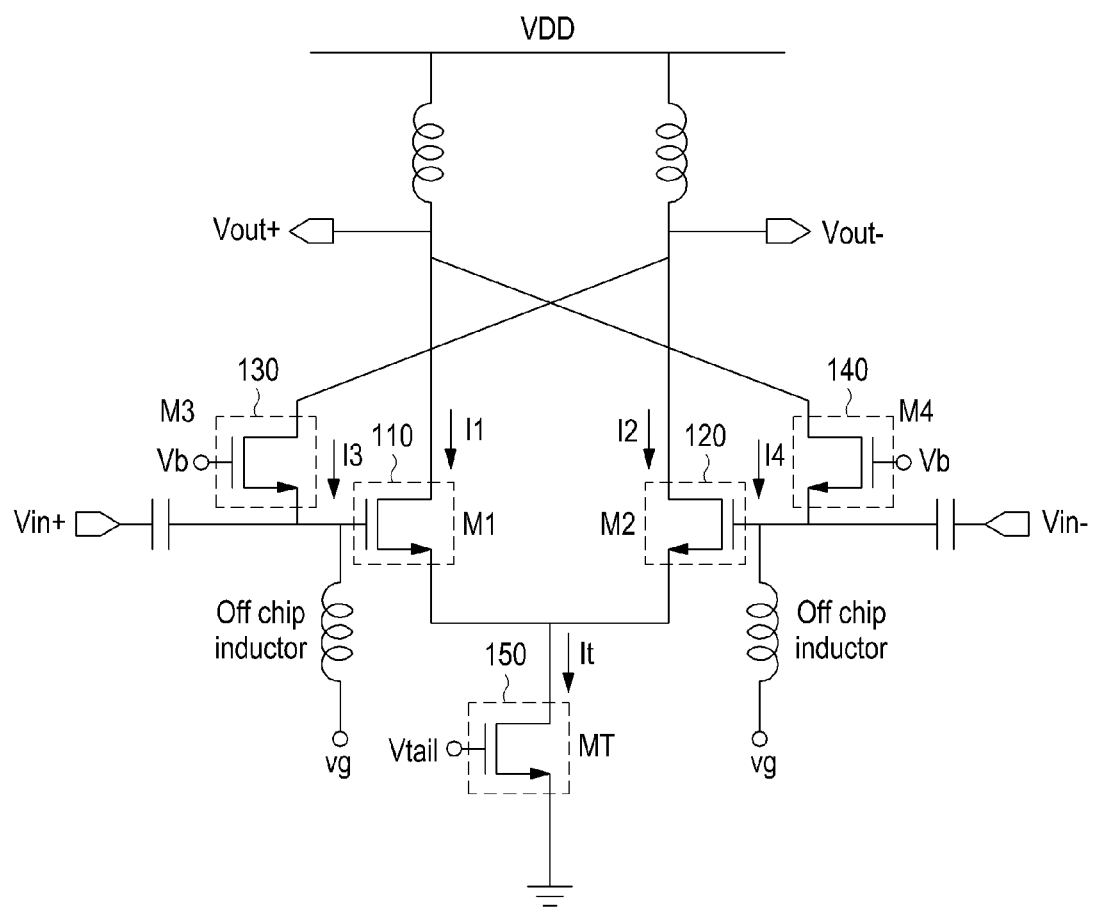
FIG. 2 is a circuit diagram illustrating a drive amplifier in accordance with an embodiment of the present invention.

Referring to FIG. 2, the drive amplifier includes a first transistor M1, 110 and a second transistor M2, 120 to which differential RF voltage Vin+, Vin− are respectively input, a third transistor M3, 130 and a fourth transistor M4, 140, each of which is connected to each of the first and second transistors M1, 110; M2, 120 in a cascade structure, and a fifth or tail current transistor MT, 150 that determines the current flowing in the entire drive amplifier, to operate as a constant current source.

A power supply voltage VDD is applied to the drain terminal of the first transistor M1, 110, a first differential RF voltage Vin+ is applied to the gate terminal of the first transistor M1, 110, and the source terminal of the first transistor M1, 110 is connected to the drain terminal of the tail current transistor MT, 150. The current flow in the first transistor M1, 110 is indicated in FIG. 2 as "I1".

Further, a bias voltage Vg is applied to the gate terminal of the first transistor M1, 110, preferably via an off chip inductor.

The power supply voltage VDD is applied to the drain terminal of the second transistor M2, 120, a second differential RF voltage Vin− is applied to the gate terminal of the second transistor M2, 120, and the source terminal of the second transistor M2, 120 is connected to the drain terminal of the tail current transistor MT, 150. The current flow in the second transistor M2, 120 is indicated in FIG. 2 as "I2".

Further, a bias voltage Vg is applied to the gate terminal of the second transistor M2, 120, preferably via an off chip inductor.

The drain terminal of the third transistor M3, 130 is connected to the drain terminal of the second transistor M2, 120 (i.e., the drain terminal of the third transistor M3, 130 and the drain terminal of the second transistor M2, 120 are cross coupled), the source terminal of the third transistor M3, 130 is connected to the gate terminal of the first transistor M1, 110, and a bias voltage Vb is applied to the gate terminal of the third transistor M3, 130. Here, the current flowing in the third transistor M3, 130 is indicated in FIG. 2 as "I3".

Further, the power supply voltage VDD is applied to the drain terminal of the third transistor M3, 130. In an embodiment of the present invention, the power supply voltage may be applied via an inductor or resistor, with FIG. 2 showing the power supply voltage applied via inductor.

The drain terminal of the fourth transistor M4, 140 is connected to the drain terminal of the first transistor M1, 110 (i.e., the drain terminal of the fourth transistor M4, 140 and the drain terminal of the first transistor M1, 110 are cross coupled), the source terminal of the fourth transistor M4, 140 is connected to the gate terminal of the second transistor M2, 120, and a bias voltage Vb is applied to the gate terminal of the fourth transistor M4, 140. The current flow in the fourth transistor M4, 140 is indicated in FIG. 2 as I4".

Further, the power supply voltage VDD is applied to the drain terminal of the fourth transistor M4, 140. In an embodiment of the present invention, the power supply voltage may be applied via an inductor or resistor, with FIG. 2 showing the power supply voltage applied via inductor.

The third transistor M3, 130 and the fourth transistor M4, 140 may be operated in a similar manner to a common gate structure.

The source terminals of the first transistor M1, 110 and the second transistor M2, 120 are connected to the drain terminal of the tail current transistor MT, 150, the source terminal of the tail current transistor MT, 150 is grounded, and a bias voltage Vtail is applied to the gate terminal of the tail current transistor MT, 150.

In the foregoing, the structure of the drive amplifier according to an embodiment of the present invention has been described. Hereinafter, characteristics of the drive amplifier are described below making reference to FIG. 2.

In the drive amplifier having the structure as shown in FIG. 2, since the first RF input voltage Vin+ is in a differential relationship with the second RF input voltage Vin−, the voltage at the gate terminal of the second transistor M2, 120 will negatively increase when a differential voltage Vdiff is positively increases, that is, when the voltage at the gate terminal of the first transistor M2, 120 is positively increased. The voltages at the gate terminals of the first transistor M1, 110, and the second transistor M2, 120 are provided in Equation (1):

$$Vin+ = Vcm + Vdiff//2$$

$$Vin- = Vcm - Vdiff//2 \quad (1)$$

In Equation (1), Vcm denotes a common mode DC voltage, that is Vg, and Vdiff denotes the differential voltage between the two input voltages Vin+, Vin−[(Vin+)−(Vin−)].

When the first RF input voltage Vin+ is positively increased (i.e., the differential voltage Vdiff is positively increased), then the gate voltage of the first transistor M1, 110 will increase.

As a result, the current I1 flowing in the first transistor M1, 110 will increase.

However, although the differential voltage Vdiff continues to positively increase, it cannot be greater than the tail current It applied to the drain terminal of the tail current transistor MT, 150. Thus, the current I1 flowing in the first transistor M1, 110 is limited by the tail current It.

Because a positive increase in the first RF input voltage Vin+ means a negative increase in the second RF input voltage Vin−, the gate voltage of the second transistor M2, 120 and the source voltage of the fourth transistor M4, 140 will decrease.

Accordingly, because the bias voltage applied to the gate terminal of the fourth transistor M4, 140 is fixed as Vb, the current I4 flowing in the fourth transistor M4, 140 is increased.

Figure 3:
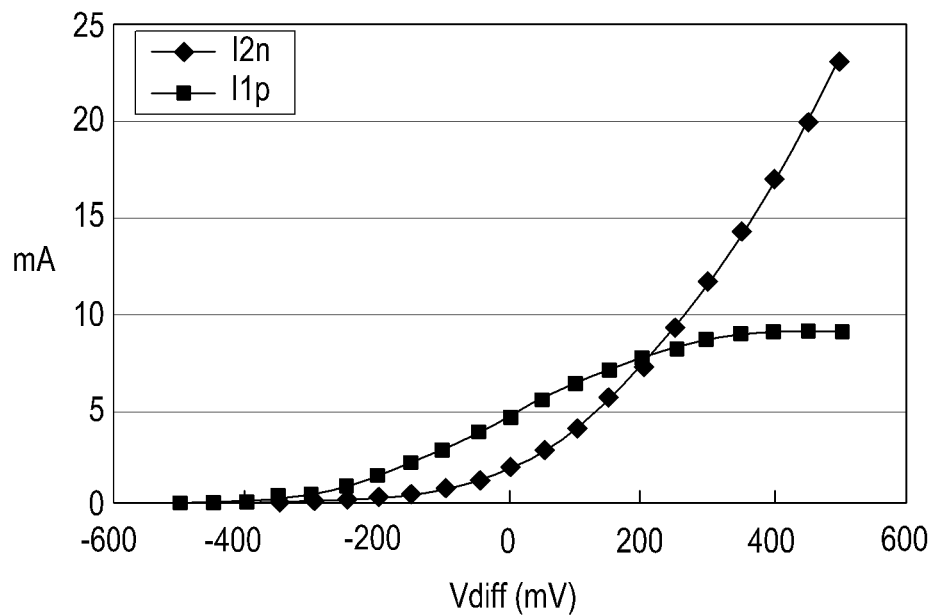
FIGS. 3 and 4 are simulation diagrams explaining the current characteristic of a drive amplifier in accordance with an embodiment of the present invention.

In the above-discussed drive amplifier according to an embodiment of the present invention as shown in FIG. 2, as the first RF input voltage Vin+ becomes positively larger (i.e., the magnitude of the differential RF voltage becomes positively larger), the current I4 flowing in the fourth transistor M4, 140 is increased in a complementary manner with the current I1 flowing in the first transistor M1, 110, which results in a linear differential output current. A complementary relationship between the current I1 flowing in the first transistor M1, 110 and the current I4 flowing the fourth transistor M4, 140 is illustrated in FIG. 3. Referring to FIG. 3, as the current I1 flowing in the first transistor M1, 110 is increased, the current I4 flowing in the fourth transistor M4, 140 is also increased.

Contrarily, as the second RF input voltage Vin− becomes positively larger (i.e., the magnitude of the differential RF voltage becomes negatively larger), the current I3 flowing in the third transistor M3, 130 is increased in a complementary manner with the current I2 flowing in the second transistor M2, 120, which results in a linear differential output current. This characteristic can be inferred from the above description of the first transistor M1, 110 and the fourth transistor M4, 140, so a detailed description thereof need not be repeated.

Figure 4:
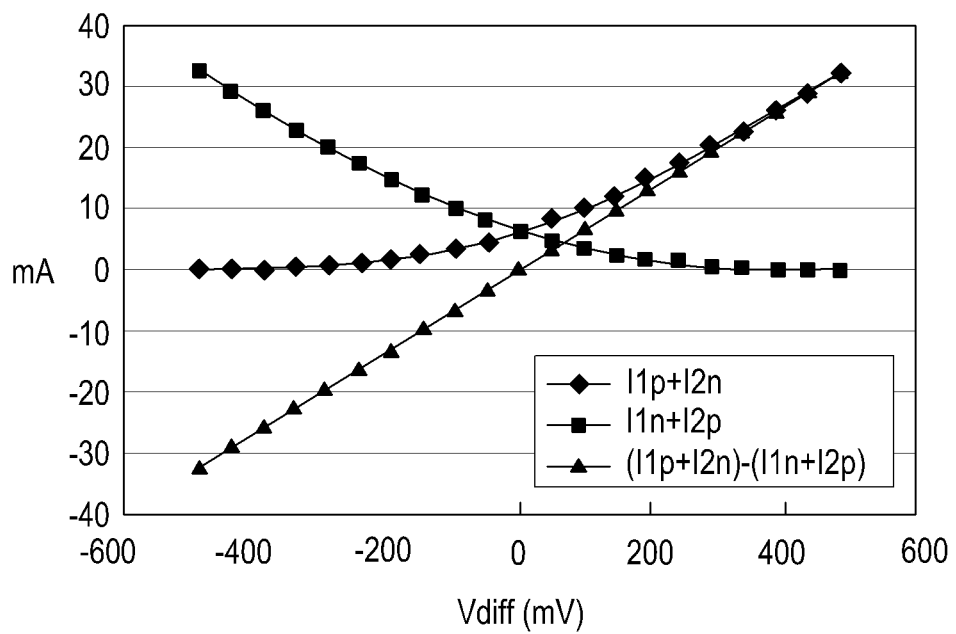

FIG. 4 is a simulation diagram explaining the current characteristic of a drive amplifier according to an embodiment of the present invention.

Referring to FIG. 4, a differential output current [(I1+I4)−(I2+I3)] is linear due to the complementary current characteristic between the first transistor M1, 110 and the fourth transistor M4, 140 and the complementary current characteristic between the second transistor M2, 120 and the third transistor M3, 130. That is, the drive amplifier according to an embodiment of the present invention has improved linearity.

Because there is no current flow in the third transistor M3, 130 when the first RF input voltage Vin+ is higher than a specific value and there is no current flow in the fourth transistor M4, 140 when the second RF input voltage Vin− is higher than a specific value, the overall DC current consumption can also be reduced.

Figure 5:
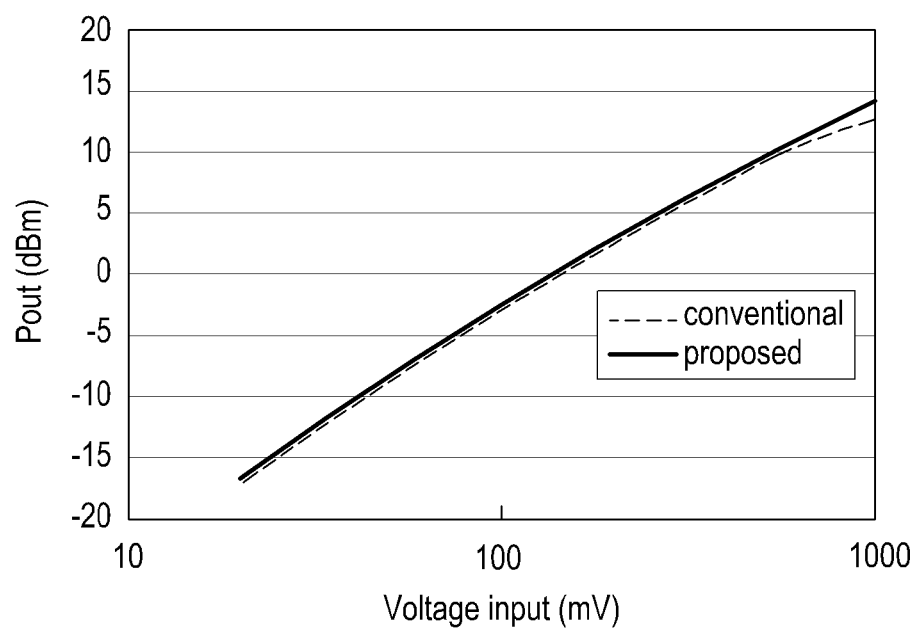
FIG. 5 is a simulation diagram explaining the output characteristic of a drive amplifier in accordance with an embodiment of the present invention.

FIG. 5 is a simulation diagram explaining the output characteristic of a drive amplifier according to an embodiment of the present invention.

In FIG. 5, the voltage output characteristic of the drive amplifier according to an embodiment of the present invention is shown together with the output characteristic of a conventional drive amplifier, as shown in FIG. 1.

As shown in FIG. 5, the output P1dB of the drive amplifier according to an embodiment of the present invention as shown in FIG. 2 was 6.82 dBm, and the output P1dB of the conventional drive amplifier as shown in FIG. 1 was 6 dBm. That is, the drive amplifier of the present invention exhibits a superior output characteristic compared to the conventional drive amplifier.

In addition, while a DC current of 26.96 mA was consumed in the conventional drive amplifier having an output P1dB characteristic of 6 dBm, a DC current of 12.84 mA was consumed in the drive amplifier of the present invention.

Therefore, the drive amplifier of the present invention is superior in both voltage and current characteristics to the conventional drive amplifier.

The simulation results of FIG. 5 are similar of output P1dB for the sake of comparison of current characteristics. However, the drive amplifier of the present invention provides improved current characteristic compared to the conventional drive amplifier while having a higher output P1dB.

While the present invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A drive amplifier comprising:
   first and second transistors each including a gate to which first and second differential Radio Frequency (RF) voltages are respectively input;
   a third transistor including a drain connected to a drain of the second transistor and a source connected to the gate of the first transistor, wherein a drain-source current of the third transistor increases with an increase in the second differential RF voltage; and
   a fourth transistor including a drain connected to a drain of the first transistor and a source connected to the gate of the second transistor, wherein a drain-source current of the fourth transistor increases with an increase in the first differential RF voltage.

2. The drive amplifier as claimed in claim 1, further comprising a constant current source for controlling a current flowing in the drive amplifier.

3. The drive amplifier as claimed in claim 2, wherein the constant current source includes a fifth transistor, a drain of which is connected to the source of each of the first transistor and the second transistor.

4. The drive amplifier as claimed in claim 1, wherein a set bias voltage is applied to gate terminals of the third and fourth transistors, respectively.

5. The drive amplifier as claimed in claim 1, wherein a bias voltage is applied to gate terminals of the first and second transistors via an off chip inductor, respectively.

6. The drive amplifier as claimed in claim 1, wherein, there is no current flow in the third transistor when the first differential RF voltage is higher than a specific value.

7. The drive amplifier as claimed in claim 1, wherein, there is no current flow in the fourth transistor when the second differential RF voltage is higher than a specific value.

8. A drive amplifier comprising:
   first and second transistors each including a gate to which first and second differential Radio Frequency (RF) voltages are respectively input;
   a third transistor including a drain connected to a drain of the second transistor and a source connected to the gate of the first transistor, wherein a drain-source current of the third transistor increases with an increase in the second differential RF voltage; and
   a fourth transistor including a drain connected to a drain of the first transistor and a source connected to the gate of the second transistor, wherein a drain-source current of the fourth transistor increases with an increase in the first differential RF voltage,
   wherein the voltages are determined by:

$$Vin+=Vcm+Vdiff/2$$

$$Vin-=Vcm-Vdiff/2$$

where Vcm denotes a common mode DC voltage, that is Vg, and Vdiff denotes the differential voltage between the two input voltages Vin+, Vin−[(Vin+)−(Vin−)].

9. The drive amplifier as claimed in claim 8, further comprising a constant current source for controlling a current flowing in the drive amplifier.

10. The drive amplifier as claimed in claim 9, wherein the constant current source includes a fifth transistor, a drain of which is connected to the source of each of the first transistor and the second transistor.

11. The drive amplifier as claimed in claim 8, wherein a set bias voltage is applied to gate terminals of the third and fourth transistors, respectively.

12. The drive amplifier as claimed in claim 8, wherein a bias voltage is applied to gate terminals of the first and second transistors via an off chip inductor, respectively.

13. The drive amplifier as claimed in claim 8, wherein, there is no current flow in the third transistor when the first differential RF voltage is higher than a specific value.

14. The drive amplifier as claimed in claim 8, wherein, there is no current flow in the fourth transistor when the second differential RF voltage is higher than a specific value.

\* \* \* \* \*